United States Patent [19]

Allen

[11] Patent Number: 4,476,403

[45] Date of Patent: Oct. 9, 1984

[54] LOW LEVEL LOGIC TO HIGH LEVEL LOGIC TRANSLATOR HAVING IMPROVED HIGH STATE DRIVE

[75] Inventor: Gordon H. Allen, Mesa, Ariz.

[73] Assignee: Motorola, Inc., Schaumburg, Ill.

[21] Appl. No.: 405,013

[22] Filed: Aug. 4, 1982

[51] Int. Cl.³ .................. H03K 19/092; H03K 17/16; H03K 17/60

[52] U.S. Cl. .................................. 307/475; 307/443; 307/254

[58] Field of Search ............... 307/443, 454, 456, 457, 307/458, 459, 466, 467, 475, 264, 270, 254, 255, 315; 330/310, 273, 262, 263

[56] References Cited

U.S. PATENT DOCUMENTS

| | | | |
|---|---|---|---|
| 4,132,906 | 1/1979 | Allen | 307/443 |
| 4,321,490 | 3/1982 | Bechdolt | 307/443 X |
| 4,330,723 | 5/1982 | Griffith | 307/443 X |

Primary Examiner—Larry N. Anagnos
Assistant Examiner—David R. Bertelson
Attorney, Agent, or Firm—Michael D. Bingham

[57] ABSTRACT

A TTL to high level translator having improved high state current drive includes a push-pull output stage and a lateral PNP transistor for supplying current drive when the translator is in a high state. The output stage consists of a pair of Darlington connected transistors comprising an upper amplifier and a lower transistor amplifier connected in series with the upper amplifier. A current transient suppressor circuit circuit is coupled with the bases of the pair of Darlington connected transistors for inhibiting power supply current spikes as the upper and lower amplifiers are alternately turned on and off in response to the TTL logic signal switching between upper and lower level states.

6 Claims, 1 Drawing Figure

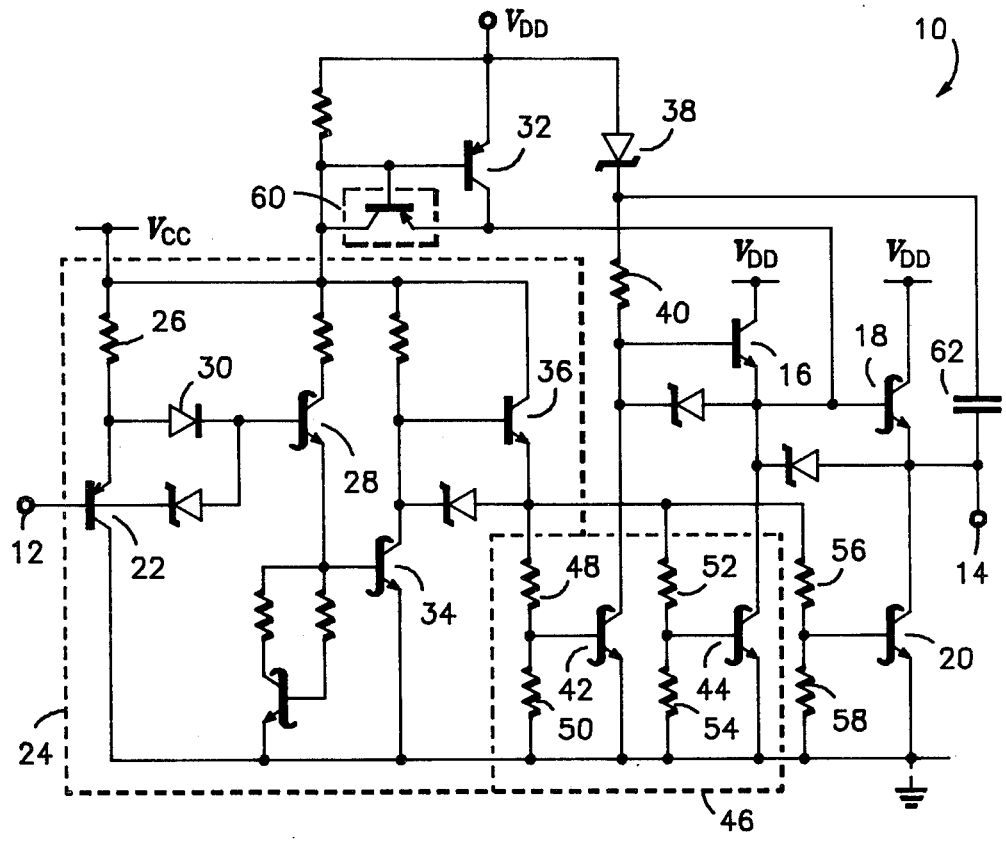

LOW LEVEL LOGIC TO HIGH LEVEL LOGIC TRANSLATOR HAVING IMPROVED HIGH STATE DRIVE

BACKGROUND OF THE INVENTION

The present invention relates to logic circuits, more particularly, to voltage level translator circuits for translating the level of an applied input logic signal to a second level logic output signal.

Present logic level translator circuits typically employ a push-pull output driver stage which is comprised of an upper Darlington transistor amplifier series connected at the ouput of the circuit to a lower transistor amplifier between a DC voltage supply. In operation, in response to the input logic signal being in a first level state, the Darlington transistor amplifier, for instance, is turned-on to source current to the output of the circuit. When the input logic state transitions to a second level, the lower amplifier is turned-on while the Darlington amplifier is turned-off whereby current is sourced from the output of the circuit. Thus, an output logic signal having a high state and a low state is produced to a load that is coupled to the output of the circuit. Depending on the current gain of the Darlington amplifier and the relative impedance of the load, the output logic signal can have a larger voltage swing than the input logic signal, i.e., a higher logic level.

Most, if not all, of the above described prior art circuits are limited to the amount of voltage level shift that can be produced when large current requirements are needed. Although the Darlington configuration can supply large output load currents the offset voltages developed there across in addition to other circuit parameters typically limits the voltage that can be developed across the load to a value generally two or more volts less than the D.C. supply voltage potential. Moreover, some prior art circuits dissipate considerable power when the circuit is in a low logic state.

Hence, there is a need for a translator circuit of the type above that can supply large load currents (20ma or more) while maximizing the voltage level swing at the output and reducing power dissipation in the circuit. Additionally, in conjunction with the foregoing, such a translator circuit should not introduce any undesirable side effects such as power supply current spikes and/or poor waveform quality.

Accordingly it is an object of the present invention to provide an improved logic level translator circuit.

It is also an object of the present invention to provide a logic level translator circuit suitable for manufacturer in integrated circuit form.

Still another object of the present invention is to provide an integrated logic level translator circuit having improved high drive state for producing maximum voltage level shift with large current drive.

An additional object of the present invention is to provide an integrated logic level translator circuit which can supply large load current and maximum voltage level shift without introducing undesirable characteristics such as high DC power dissipation, power supply current transients and distorted waveform quality.

SUMMARY OF THE INVENTION

In accordance with the above and other objects there is provided a circuit for tanslating a low level logic signal supplied to an input of the circuit to a higher level logic signal. The circuit comprises an output stage which includes a pair of transistors connected in a Darlington amplifier configuration with the output one of the transistors series connected at the output of the circuit to a lower transistor amplifier. The improvement comprises a current switch that is responsive to the low level logic input signal being in a first level state for supplying high current drive to the output one of the transistors of the Darlington amplifier to supply the load current and a transient suppressor circuit responsive to the low level logic signal switching between said first level state and a second level state for sequentially turning off the pair of transistors and then turning on the lower transistor amplifier while causing the lower transistor amplifier to be turned off before either one of the pair of transistors of the Darlington amplifier are turned on as the low level logic signal transitions from the second level state to the first level state.

BRIEF DESCRIPTION OF THE DRAWING

The sole FIGURE is a schematic diagram illustrating the circuit of the preferred embodiment.

DETAILED DESCRIPTION OF THE PREFERRED EMBODIMENT

The FIGURE illustrates logic level translator circuit 10 in schematic diagram form. Translator circuit 10 is suited to be fabricated in monolithic integrated circuit form and provides a voltage level shifting of a low level logic signal supplied to input terminal 12 to produce a high level logic signal across a load (not shown) which would be coupled to output 14.

As will be fully explained, the function of circuit 10 is to produce a superior high state drive to output terminal 14 without introducing any undesirable side effects such as high DC power dissipation, power supply current spikes/transients and/or poor output waveform quality.

Translator circuit 10 comprises a push-pull output stage including an upper Darlington transistor amplifier consisting of NPN transistors 16 and 18. The Darlington transistor amplifier is series connected, at output 14, to lower transistor amplifier 20 between the power supply potential $V_{DD}$ and ground reference. The Darlington amplifier and transistor amplifier 20 are alternately turned-on and off in response to the low level logic signal supplied to input 12 to alternately source current to and from output terminal 14.

The low level logic input signal, which as an example may be a TTL logic signal, is supplied at input terminal 12 to the base of PNP transistor 22 of signal splitting stage 24. The emitter of transistor 22 is coupled through resistor 26 to a source of operating potential $V_{CC}$ with the collector thereof being coupled to ground reference. (It is noted that some components, not germane to the invention, are not called out as they provide circuit function familiar to those skilled in the art.)

If the low level logic input signal is in a high or first level state, transistor 22 is biased off which causes NPN transistor 28 to be biased-on as base current is supplied via resistor 26 and diode 30. (It is further noted that devices fabricated using known Schottky processes are differentiated from those devices fabricated utilizing known bipolar processes as indicated by the base structure of transistor 28 with respect to the base of transistor 22, for instance.) With transistor 28 turned-on base current is supplied via the collector-emitter path of transistor 28 to turn on lateral-PNP transistor 32. Transistor 28 supplies base current drive to Schottky NPN transistor 34 rendering it conductive to cause NPN transistor 36 to be rendered nonconductive. Thus, in this high level state, signal splitting stage 24 provides switching signals to turn on PNP current switch transistor 32 while rendering output transistor 20 non-conductive since no base current drive is supplied thereto from the emitter of transistor 36.

Transistor 36 being turned-off causes transistor 42 to be nonconductive allowing base current to flow from $V_{DD}$, via diode 38 and resistor 40 to the base of input transistor 16 of the Darlington amplifier. This turns on output transistor 18. Transistor 32 supplies base drive current from its collector to the base of transistor 18 to produce load current at output 14. By utilizing a lateral PNP a large load current can be supplied while producing an output voltage level of nearly $V_{DD}$ across the load. For example, it is possible to supply a load current of 20ma to produce a voltage at terminal 14 of magnitude approximately equal to $V_{DD}$. It is understood that $V_{DD}$ may be equal to or different from $V_{CC}$ without varying the scope of the present invention.

When the input logic signal goes from a high level to a low level (second level) transistor 22 is rendered conductive which turns off diode 30 and transistors 28 and 32. Transistor 34 is also turned-off which allows transistor 36 to be turned-on to supply base current to transistor 20. Transistors 42 and 44 of transient suppressor circuit 46 are rendered conductive as transistor 36 is turned-on to steal base drive from transistors 16 and 18 respectively which, in conjunction with transistor 32 being turned off, shuts off the Darlington amplifier. Current is therefore sourced from output 14 through transistor 20 to produce a low level state across the load.

Transient suppression is provided by transient suppressor circuit 46 as the logic input signal switches from both a low-to-high state and vice versa to inhibit power supply current spikes that may otherwise occur at the output. Suppression of current transients is provided by the sequential operation of transistors 42 and 44 in conjunction with transistor 20 both for a low-to-high output transition and for a high-to-low output transition.

Transistors 42, 44 and 20 each have a predetermined threshold voltage at which they become conductive when transistor 36 is rendered conductive. The threshold voltage is established by the ratios of the respective resistor divider circuits coupled to the bases of each device. Thus, for example, transistor 42 is rendered conductive when the voltage at the emitter of transistor 38 reaches 1.5 $V_{BE}$ (wherein $V_{BE}$ is the voltage developed across a forward bias base-emitter junction of a transistor: typically 0.7 volts) as set by the ratio of resistors 48 and 50. Similarly transistor 44 is rendered conductive as the emitter of transistor 36 reaches 2.0 $V_{BE}$. Transistor 20 is likewise turned-on as the emitter of transistor 36 reaches 2.5 $V_{BE}$.

For a low-to-high transition, current transients are inhibited as follows. As the input signal goes high transistor 36 is turned off whereby the voltage at the emitter thereof decreases. Transistor 20 is first caused to be turned-off as the voltage at the emitter of transistor 36 falls below its threshold level. Sequentially, transistor 44 and then transistor 42 are shut off. Thus, transistors 20 and 44 are forced to be turned-off prior to transistors 16 and 18 being turned on. This inhibits any current spike during the described transitioning state.

As the input logic signal transitions from a high-to-low state, transistor 36 is rendered conductive and the voltage at the emitter begins to increase. Transistors 42, 44 and 20 are sequentially rendered conductive as their respective threshold levels are exceeded. Transistor 42 turns off transistor 16 before transistor 44 is turned on to prevent possible current spikes therefrom. Thereafter, transistor 44 is turned-on as the voltage at the emitter of this transistor rises to turn off transistor 18 before transistor 20 is rendered conductive. This action inhibits any current spikes in this transitioning mode. Hence, current transients are inhibited during both the high-to-low and low-to-high transitioning of the circuit.

High DC power dissipation is prohibited by utilizing switched lateral PNP transistor 32. When translator circuit 10 is in low state no DC current is passed through transistor 32 as it is turned-off. A P-type diffusion ring is formed about the collector of PNP transistor 32 as understood to prevent the transistor, which is in a saturated state during a high state, from injecting a large amount of current to the parasitic substrate PNP collector. The P-ring is symbolized by the transistor enclosed within dashed-in box 60.

Due to the size and performance characteristics of PNP transistor 32, poor output waveform quality during the high to low level state transition could occur. However, transistor 44 maintains the quality of the output wave form. Thus, any residual collector current from transistor 32 that is caused by this device being slow to turn off is sunk by the collector of transistor 44.

Boot strap capacitor 62 produces excellent low-to-high transition waveform quality. Because lateral PNP transistor 32 also tends to be turned on slowly, capacitor 62 is allowed to act as a temporary battery during the low-to-high transition. Hence, capacitor 62 causes the voltage at the cathode of diode 38 to reach a peak voltage of nearly 2$V_{DD}$. The base voltage of transistor 16 reaches a level approximately one diode voltage drop above $V_{DD}$ to establish a voltage at the emitter thereof nearly equal to $V_{DD}$. As a result, the output voltage level approaches a value equal to $V_{DD}-V_{BE}$ ($V_{BE}$ is the voltage drop between the base-emitter of transistor 18). The value of capacitor 62 is chosen to maintain the aforedescribed condition long enough for transistor 32 to turn on and hold the output high.

Thus, what has been described is a novel logic translator circuit for shifting the voltage level of a low level logic input signal to a higher level. The circuit has improved high state current drive to the output thereof without introducing any undesirable side effects such as high DC power dissipation, power supply current spikes and degraded output waveform quality. Although translator circuit 10 described above utilizes Schottky devices it is to be understood that other processes could be used for fabrication of these devices without departing from the intent and scope of the present invention.

I claim:

1. Level shift circuit having improved high current drive for producing a high level logic output signal in response to receiving a low level logic input signal including a push-pull output stage consisting of an input and an output transistor connected as a Darlington amplifier which is in series with a lower transistor amplifier, the output of the circuit being taken at the interconnection of the Darlington amplifier and the lower transistor, the improvement comprising:

current switch means responsive to the logic input signal being in a first level state for supplying current drive to the output transistor of the Darlington amplifier; and transient suppressor circuit means being responsive to the logic input signal switching from said first level state to a second level state for sequentially turning off first the input transistor and then the output transistor of the Darlington amplifier prior to the lower transistor amplifier being rendered conductive, said transient suppressor circuit means being responsive to said logic input signal switching between said second level state and said first level state to prevent the Darlington amplifier from being rendered conductive until after the lower transistor amplifier is turned off such that power supply current transients are inhibited as the logic input signal alternately switches between level states.

2. Level shift circuit having improved high current drive for providing a high level logic output signal in response to receiving a low level logic input signal including a push-pull output stage consisting of an input transistor and an output transistor each having base, emitter and collector electrodes connected as a Darlington amplifier which is in series with a lower transistor amplifier forming an output of the circuit therebetween, the improvement comprising:

current switch means responsive to the logic input signal being in a first level state for supplying current drive to the output transistor of the Darlington amplifier;

transient suppressor circuit means being responsive to the logic input signal switching from said first level state to a second level state for sequentially turning off first the input transistor and then the output transistor of the Darlington amplifier prior to the lower transistor amplifier being rendered conductive, said transient suppressor circuit means being responsive to said logic input signal switching between said second level state and said first level state to prevent the Darlington amplifier from being rendered conductive until after the lower transistor amplifier is turned off such that power supply current transients are inhibited as the logic input signal alternately switches between level states; and signal splitting means having an input coupled to the input of the circuit and first and second outputs, said signal splitting means being responsive to the logic input signal for providing first and second switching signals at said first and second outputs respectively, said first output being coupled to said current switch means, said second output being coupled both to said lower transistor amplifier and said transient suppressor circuit means.

3. The circuit of claim 2 wherein said current switch means includes a lateral PNP transistor having first and second main electrodes and a control electrode, said first main electrode being coupled to a terminal at which is supplied a first source of operating potential, said second main electrode being coupled to the base electrode of the output transistor of the Darlington amplifier, said control electrode being coupled to said first output of said signal splitting means.

4. The circuit of claim 2 or 3 wherein said transient suppressor circuit means includes:

a first transistor having first and second main electrodes and control electrode, said first electrode being coupled to a terminal at which is supplied a reference potential, said second main electrode being coupled to the base electrode of the input transistor of the Darlington amplifier and to said terminal at which said operating potential is supplied, said control electrode being coupled to said second output of said signal splitting means wherein said first transistor is rendered conductive and nonconductive as the signal at said second output of said signal splitting means exceeds and decreases below a first threshold value; and a second transistor having first and second means electrodes and a control electrode, said first main electrode being coupled to said terminal receiving said reference potential, said second main electrode being coupled both to the emitter electrode of the input transistor and the base electrode of the output transistor of the Darlington amplifier, said control electrode being coupled to said second output of said signal splitting means wherein said second transistor is rendered conductive and nonconductive as the signal at said second output of said signal splitting means exceeds and decreases below a second threshold value.

5. The circuit of claim 4 wherein said lower transistor amplifier includes a third transistor having first and second main electrodes and a control electrode, said first main electrode being coupled to said terminal at which said reference potential is supplied, said second main electrode being coupled to said output of the circuit and said control electrode being coupled to said second output of said signal splitting means wherein said third transistor is rendered conductive and nonconductive as the signal at said second output exceeds and decreases below a third threshold value.

6. The circuit of claim 5 wherein said third threshold value is greater than said second threshold value and said second threshold value is greater than said first threshold value.

* * * * *